US012628440B2

(12) United States Patent     (10) Patent No.:   US 12,628,440 B2
Lim et al.     (45) Date of Patent:    May 12, 2026

(54) PHOTODIODE DEVICES, PHOTODETECTORS, AND METHODS OF FORMING PHOTODIODE DEVICES

(71) Applicant: GlobalFoundries Singapore Pte. Ltd., Singapore (SG)

(72) Inventors: Khee Yong Lim, Singapore (SG); Kiok Boone Elgin Quek, Singapore (SG); Kian Ming Tan, Singapore (SG); Wei Sin Phang, Singapore (SG); Xiaoping Wang, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 693 days.

(21) Appl. No.: 18/145,258

(22) Filed: Dec. 22, 2022

(65) Prior Publication Data

US 2024/0213390 A1   Jun. 27, 2024

(51) Int. Cl.
| | |
|---|---|
| *H10F 30/225* | (2025.01) |
| *H10F 77/00* | (2025.01) |
| *H10F 71/00* | (2025.01) |

(52) U.S. Cl.
CPC ....... *H10F 30/2255* (2025.01); *H10F 77/959* (2025.01); *H10F 71/1221* (2025.01)

(58) Field of Classification Search
CPC .................................................... H10F 30/225
See application file for complete search history.

(56) References Cited

U.S. PATENT DOCUMENTS

| | | | |
|---|---|---|---|
| 7,233,051 B2 | 6/2007 | Morse et al. | |
| 8,883,616 B2 | 11/2014 | Bratkovski et al. | |
| 9,614,119 B2 | 4/2017 | Kang et al. | |
| 11,251,326 B2 * | 2/2022 | Szelag | H10F 77/306 |
| 2014/0186991 A1 * | 7/2014 | Huang | H10F 30/225 |
| | | | 438/91 |
| 2015/0028443 A1 * | 1/2015 | Shi | H10F 77/122 |
| | | | 257/438 |
| 2019/0019903 A1 | 1/2019 | Ye et al. | |
| 2019/0378949 A1 | 12/2019 | Simoyama | |
| 2021/0202764 A1 | 7/2021 | Jacob et al. | |
| 2022/0050184 A1 | 2/2022 | Paul et al. | |
| 2022/0140157 A1 | 5/2022 | Yu | |
| 2022/0359580 A1 * | 11/2022 | Zheng | H10F 39/8033 |

OTHER PUBLICATIONS

Huang, M. et al., "Germanium on Silicon Avalanche Photodiode," IEEE Journal of Selected Topics in Quantum Electronics, vol. 24, No. 2, Mar./Apr. 2018, pp. 1-11.
EP Search Report from related matter EP23201737.6 dated Apr. 3, 2024.

* cited by examiner

*Primary Examiner* — Benjamin P Sandvik

(57) ABSTRACT

A photodiode device may include a semiconductor substrate, a multiplication layer disposed in the semiconductor substrate and having a first width, a dielectric layer disposed over the multiplication layer, a charge layer coupled to the multiplication layer and having a second width, and an absorption layer disposed over the charge layer and having a third width. The second width of the charge layer may be smaller than the first width of the multiplication layer, and the third width of the absorption layer may be greater than the second width of the charge layer.

18 Claims, 14 Drawing Sheets

100

X                                                          X'

118                                    120

X                                                          X'

PHOTODIODE DEVICES, PHOTODETECTORS, AND METHODS OF FORMING PHOTODIODE DEVICES

BACKGROUND

The present disclosure relates to a photodiode device, a photodetector including the photodiode device, and a method of forming the photodiode device.

A photodetector including one or more photodiode devices may be used for detecting photons in various applications ranging from biosensing and imaging to optical communications and computing. Conventional photodiode devices, for example, avalanche photodiode devices, may be based on a PN junction that can be reverse biased to absorb photons in a depletion region across the PN junction.

These conventional photodiode devices may have relatively high dark current rates, and thus it is desirable to provide an improved photodiode device with reduced dark count rates without sacrificing quantum efficiency. Conventional photodiode devices also may be susceptible to premature breakdown, and thus it is also desirable to provide an improved photodiode device with a reduced likelihood of premature breakdown.

SUMMARY

Embodiments of the present application relate to a photodiode device, a photodetector including the photodiode device, and a method of forming the photodiode device.

In an embodiment, a photodiode device includes a semiconductor substrate, a multiplication layer disposed in the semiconductor substrate and having a first width, a dielectric layer disposed over the multiplication layer, a charge layer coupled to the multiplication layer and having a second width, and an absorption layer disposed over the charge layer and having a third width. The second width of the charge layer is smaller than the first width of the multiplication layer, and the third width of the absorption layer is greater than the second width of the charge layer.

In an embodiment, a photodetector includes a photodiode device configured to detect near-infrared (NIR) photons and a control circuit configured to control an operation of the photodiode device. The photodiode device includes a semiconductor substrate, a multiplication layer disposed in the semiconductor substrate and having a first width, a dielectric layer disposed over the multiplication layer, a charge layer coupled to the multiplication layer and having a second width, and an absorption layer disposed over the charge layer and having a third width. The second width of the charge layer is smaller than the first width of the multiplication layer, and the third width of the absorption layer is greater than the second width of the charge layer.

In an embodiment, a method of forming a photodiode device includes providing a substrate, forming a multiplication layer that has a first width in the substrate, forming a dielectric layer over the multiplication layer, forming a charge layer that has a second width, and forming an absorption layer that has a third width over the charge layer. The second width of the charge layer may be smaller than the first width of the multiplication layer, and the third width of the absorption layer may be greater than the second width of the charge layer.

DETAILED DESCRIPTION

Embodiments of the present application relate to a photodiode device, a photodetector including the photodiode device, and a method of forming the photodiode device.

A detailed description of embodiments is provided below along with accompanying figures. The scope of this disclosure is limited by the claims and encompasses numerous alternatives, modifications and equivalents. Although steps of various processes are presented in a given order, embodiments are not necessarily limited to being performed in the listed order. In some embodiments, certain operations may be performed simultaneously, in an order other than the described order, or not performed at all.

Numerous specific details are set forth in the following description. These details are provided to promote a thorough understanding of the scope of this disclosure by way of specific examples, and embodiments may be practiced according to the claims without some of these specific details. Accordingly, the specific embodiments of this disclosure are illustrative, and are not intended to be exclusive or limiting. For the purpose of clarity, technical material that is known in the technical fields related to this disclosure has not been described in detail so that the disclosure is not unnecessarily obscured.

Figure 1:
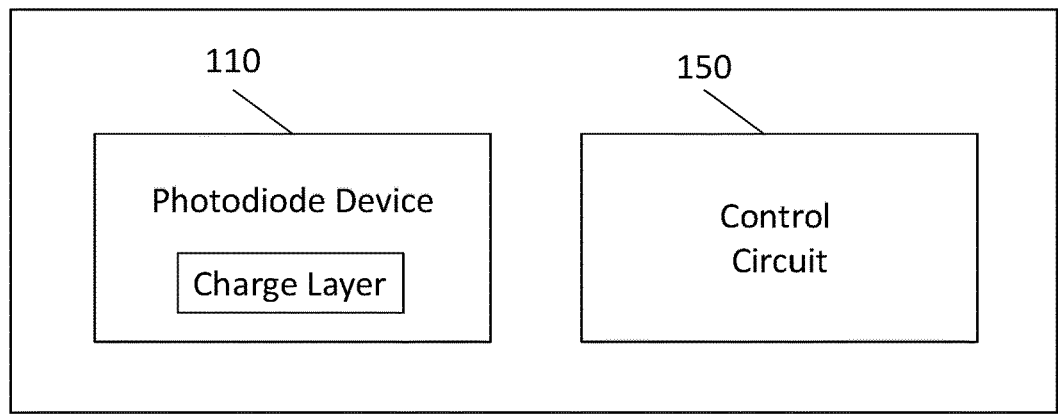
FIG. 1 illustrates a schematic diagram of a photodetector according to an embodiment.

FIG. 1 illustrates a schematic diagram of a photodetector 100 according to an embodiment. For example, the photodetector 100 is used for detection of near-infrared (NIR) photons.

The photodetector 100 in FIG. 1 includes a photodiode device 110 that detects photons and generates a current indicative of the detected photons. In an embodiment, the photodiode device 110 is an avalanche diode, for example, a single-photon avalanche diode (SPAD).

The photodiode device 110 in FIG. 1 may have a structure including an absorption layer, a charge layer, and a multiplication layer. In an embodiment, the absorption layer and the multiplication layer are separated from each other by the charge layer.

The photodetector 100 in FIG. 1 further includes a control circuit 150 controlling an operation of the photodiode device 110. In an embodiment, the control circuit 150 is electrically coupled to the photodiode device 110 and is configured to apply a bias voltage to the photodiode device 110 for detection of a photon, sense an avalanche current generated from the photodiode device 110, quench avalanche current by adjusting the bias voltage, and restore the bias voltage to an operating level for detection of another photon.

Figure 2:
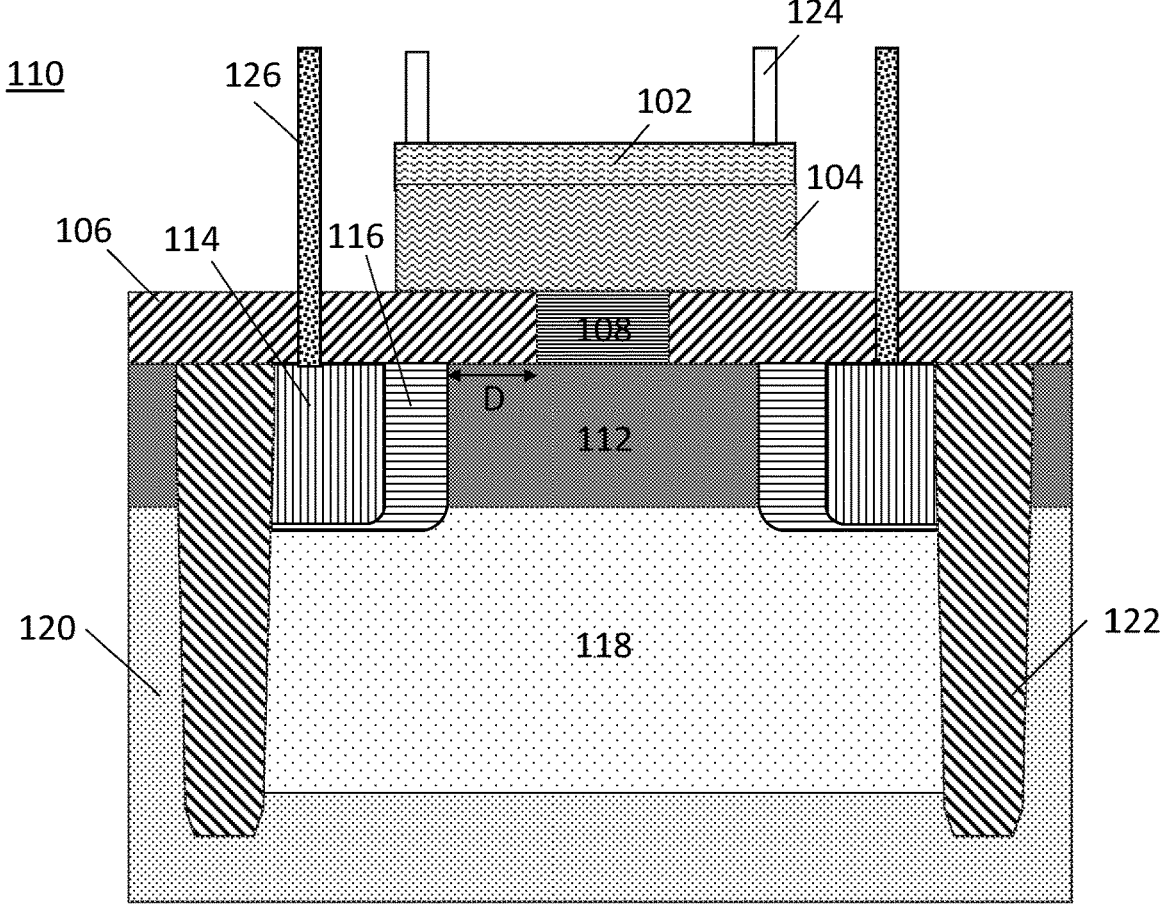
FIG. 2 illustrates a simplified cross-sectional view of a photodiode device in FIG. 1 according to an embodiment.

FIG. 2 illustrates a simplified cross-sectional view of the photodiode device 110 in FIG. 1 according to an embodiment. The photodiode device 110 may be a single-photon avalanche diode (SPAD).

Referring to FIG. 2, the photodiode device 110 includes a substrate 120. In an embodiment, the substrate 120 is a semiconductor substrate of a first conductivity type. For example, the substrate 120 is a P-type silicon substrate.

The photodiode device 110 in FIG. 2 further includes a well region 118 disposed in the substrate 120. In an embodiment, the well region 118 is a well region of a second conductivity type having a given doping profile. For example, the well region 118 is a well region of N-type having a retrograde doping profile.

The photodiode device 110 in FIG. 2 further includes first doped regions 114 and second doped regions 116 that are disposed over the well region 118. The first and second doped regions 114 and 116 may be doped with dopants of a second conductivity type, and the first doped regions 114 may have a doping concentration that is higher than a doping concentration of the second doped regions 116 to function as contact layers coupled to first electrodes (e.g., cathode electrodes) 126.

The photodiode device 110 in FIG. 2 has a structure including separate absorption, charge, and multiplication layers. For example, the photodiode device 110 in FIG. 2 includes an absorption layer 104, a charge layer 108, and a multiplication layer 112, such that the absorption layer 104 and the multiplication layer 112 are separated from each other by the charge layer 108.

The absorption layer 104 in FIG. 2 absorbs incident energy at a given range of wavelengths to create electron-hole pairs. In an embodiment, the absorption layer 104 includes one or more materials to effectively absorb near-infrared (NIR) photons. For example, the absorption layer 104 is an epitaxial SiGe layer having a relatively low bandgap value to increase quantum efficiency for NIR detection.

The absorption layer 104 in FIG. 2 has a relatively large optically sensitive area for collecting incident photons, thereby increasing a fill factor. In an embodiment, the absorption layer 104 has a width (e.g., a diameter) in a specific direction (e.g., the horizontal direction in FIG. 1) greater than that of the charge layer 108. For example, a ratio of the width of the absorption layer 104 to a width of the charge layer 108 is in a range from 1.5 to 2.5. In the embodiment of FIG. 2, the width of the absorption layer 104 is substantially the same along the depth of the layer. However, embodiments of the present disclosure are not limited thereto.

The charge layer 108 in FIG. 2 is coupled to the multiplication layer 112 and generates an electric field to drift the electrons into the multiplication layer 112 when the photodiode device 110 is reverse-biased, the electric field being sufficiently high to ensure avalanche breakdown and reduce recombination in the multiplication layer 112. In an embodiment, the charge layer 108 is a silicon layer doped with dopants of a first conductivity type having a relatively high doping concentration. For example, the charge layer 108 includes P-type dopants with a doping concentration greater than a doping concentration of the absorption layer 104, which is doped with P-type dopants.

The charge layer 108 in FIG. 2 provides a relatively small area through which electrons pass into the multiplication layer 112, thereby guiding the electrons into a specific region of the multiplication layer 112. Through the guided transport of the electrons, recombination may be reduced compared to when electrons are drifted to the entire region of the multiplication layer 112. In addition, since the charge layer 108 in FIG. 2 has a small width relative to the multiplication layer 112, the charge layer 108 is spaced apart from the first and second doped regions 114 and 116 by a given distance. In an embodiment, the distance is sufficiently long to prevent breakdown at an edge of the charge layer 108. For example, a distance D between an edge of the charge layer 108 and an inner edge of the second doped region 116 is in a range from 0.2 to 1 μm.

The charge layer 108 in FIG. 2 is disposed in a dielectric layer 106 and between the absorption layer 104 and the multiplication layer 112 to separate the absorption layer 104 and the multiplication layer 112 from each other. For example, the dielectric layer 106 in FIG. 2 has an opening with a width that is smaller than the width of the absorption layer 104, and the charge layer 108 is disposed in the opening of the dielectric layer 106. When electron-hole pairs are thermally generated in the absorption layer 104 in the absence of photon-generated carriers, the thermally generated carriers may be recombined while passing through the charge layer 108 to reduce dark counts and afterpulsing. In an embodiment, the dielectric layer 106 is an oxide-nitride-oxide (ONO) layer.

The multiplication layer 112 in FIG. 2 is disposed in the semiconductor substrate 120, and may include a material having desirable avalanche properties (e.g., high gain bandwidth and low noise). In an embodiment, the multiplication layer 112 is an intrinsic silicon layer. The multiplication layer 112 may have a width that is greater than the width of the adjacent charge layer 108.

As described above with reference to FIG. 2, the photodiode device 110 includes the multiplication layer 112 having a first width in a first direction (e.g., the horizontal direction in FIG. 2), the charge layer 108 having a second width in the first direction, and the absorption layer 104 having a third width in the first direction. The second width of the charge layer 108 is smaller than the first width of the multiplication layer 112, and the third width of the absorption layer 104 is greater than the second width of the charge layer 108. The multiplication layer 112, the charge layer 108, and the absorption layer 104 may be stacked in a second direction orthogonal to the first direction.

The photodiode device 110 in FIG. 2 further includes a contact layer 102 disposed over the absorption layer 104 and connected to second electrodes (e.g., anode electrodes) 124. In an embodiment, the contact layer 102 is a silicon layer doped with dopants of a first conductivity type having a doping concentration greater than a doping concentration of the absorption layer 104. For example, the contact layer 102 includes P-type dopants with a doping concentration greater than the doping concentration of the absorption layer 104 doped with P-type dopants.

FIGS. 3A, 3B, 4A, 4B, 5A, 5B, 6A, 6B, 7A, 7B, 8A, 8B, 9A, and 9B illustrate a method of fabricating the photodiode device 110 in FIG. 1 according to an embodiment. Specifically, FIGS. 3A, 4A, 5A, 6A, 7A, 8A, and 9A are simplified top views, and FIGS. 3B, 4B, 5B, 6B, 7B, 8B, and 9B are simplified cross-sectional views along the line X-X' shown in FIGS. 3A, 4A, 5A, 6A, 7A, 8A, and 9A, respectively.

Figure 3A:
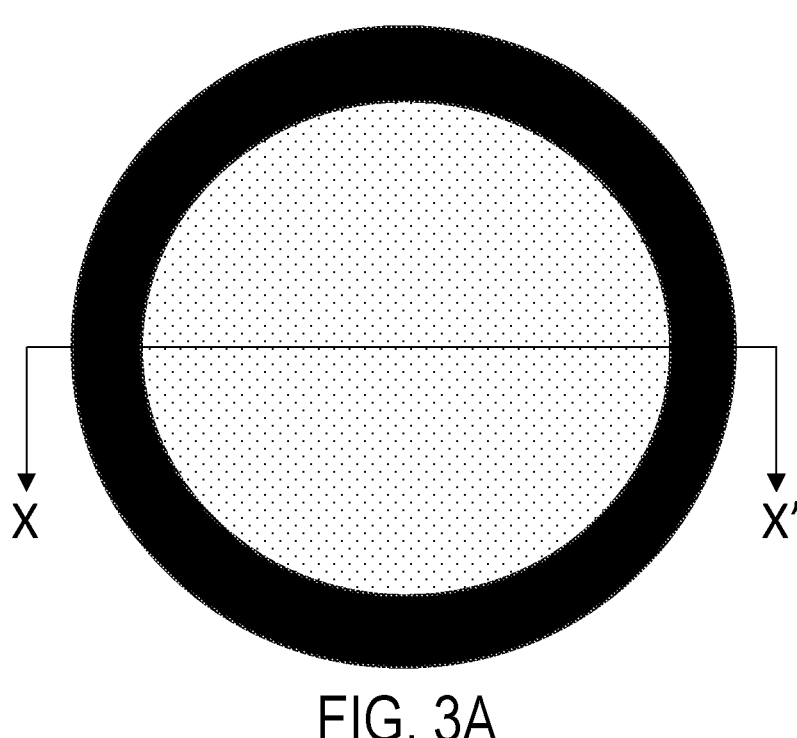
FIGS. 3A, 3B, 4A, 4B, 5A, 5B, 6A, 6B, 7A, 7B, 8A, 8B, 9A, and 9B illustrate a method of fabricating the photodiode device in FIG. 1 according to an embodiment.
Figure 3B:
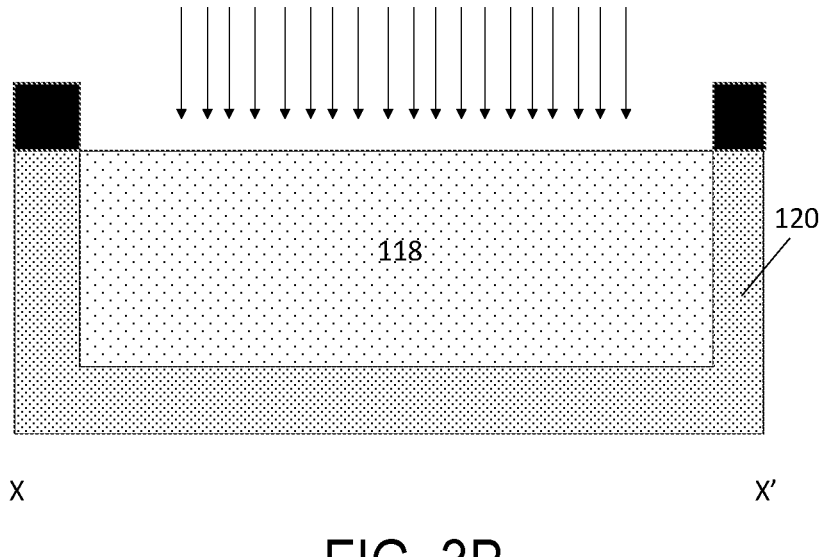

Referring to FIGS. 3A and 3B, the method includes providing a semiconductor substrate 120. In an embodiment, the semiconductor substrate 120 includes dopants of a first conductivity type (e.g., P-type dopants).

The method further includes forming a well region 118 within the semiconductor substrate 120. In an embodiment, the well region 118 is formed by doping a given region within the semiconductor substrate 120 with dopants of a second conductivity type (e.g., N-type dopants). For example, the N-type well region 118 is formed to have a retrograde doping profile within the P-type semiconductor substrate 120. As a result, a lower region in the N-type well region 118 may have a relatively high doping concentration to make the electrical resistance of a signal path formed at the lower region relatively small during an operation of the photodiode device 110 in FIG. 2.

Figure 4A:
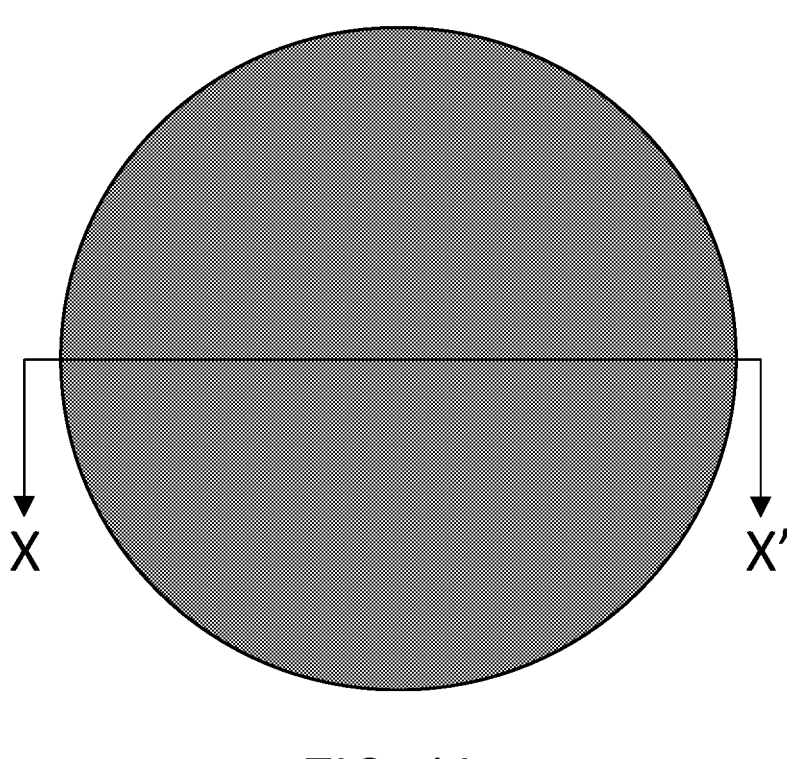
Figure 4B:
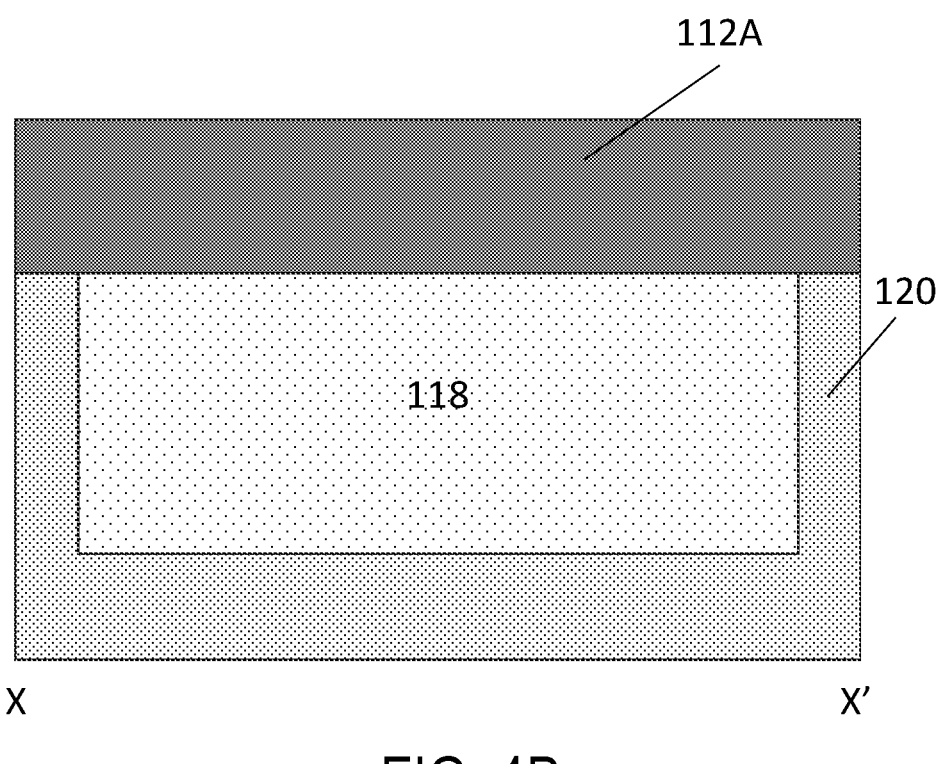

Referring to FIGS. 4A and 4B, the method includes forming a multiplication material layer 112A over the well region 118. In an embodiment, the multiplication material layer 112A is formed using a blanket epitaxial process. For example, the multiplication material layer 112A is an intrinsic silicon epitaxial layer.

Figure 5A:
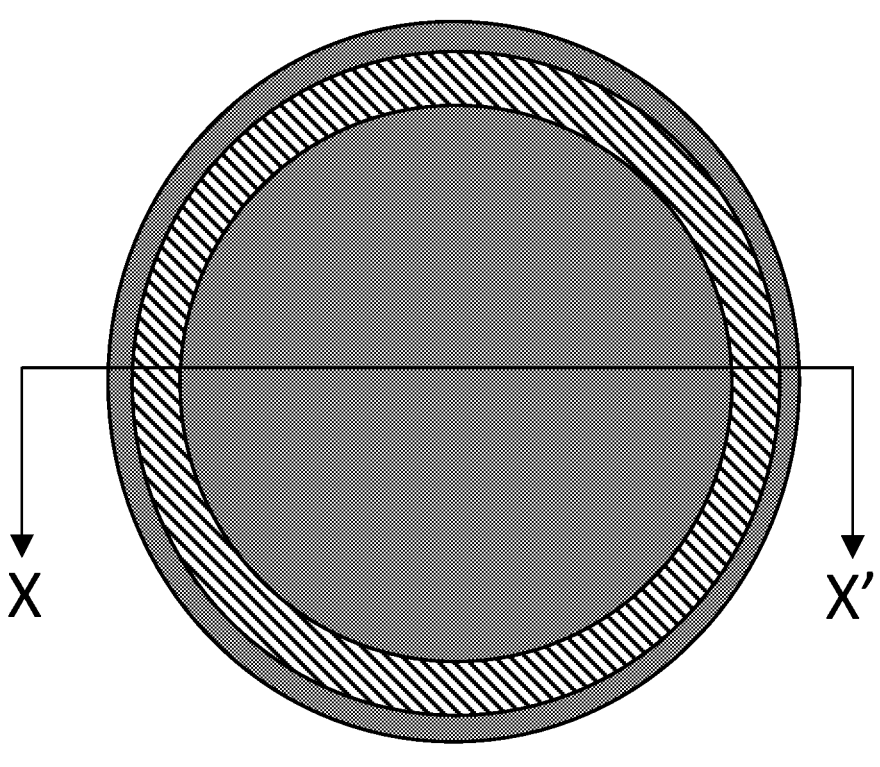
Figure 5B:
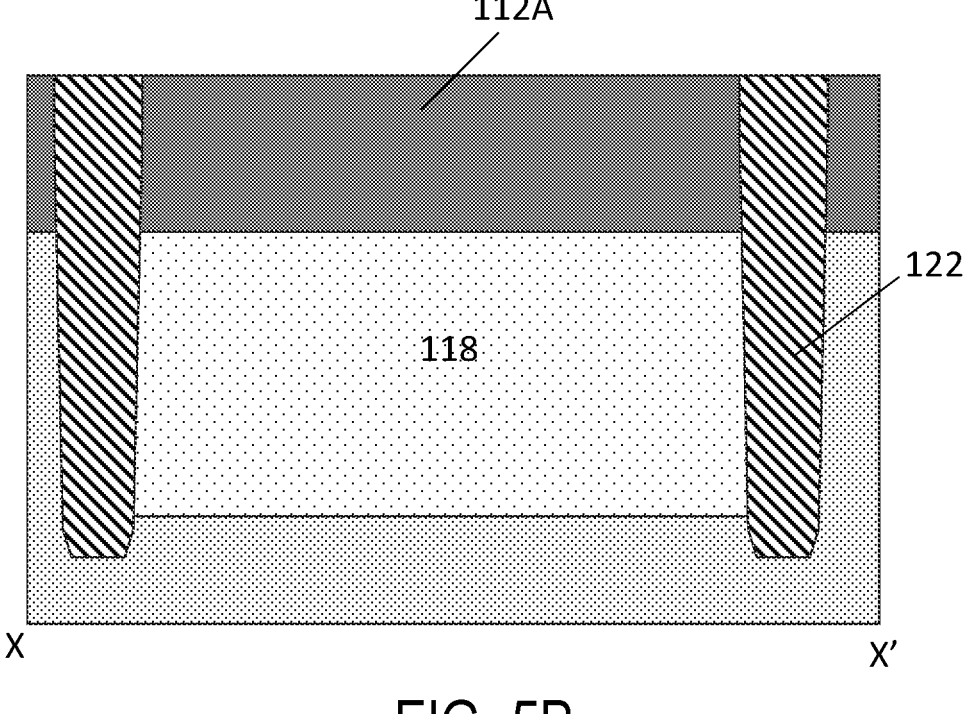

Referring to FIGS. 5A and 5B, the method includes forming an isolation structure 122 in the multiplication material layer 112A and the semiconductor substrate 120. In an embodiment, a deep trench isolation technique is used to form the isolation structure 122 that surrounds the well region 118. For example, the isolation structure 122 is formed by performing an etching process (e.g., reactive-ion etching) to form a trench around well region 118, depositing a liner film (e.g., TEOS liner) to line the trench, and depositing a core structure (e.g., poly-Si core) to fill the trench, followed by a planarization process (e.g., CMP process) to remove residual materials from the upper surface.

Figure 6A:
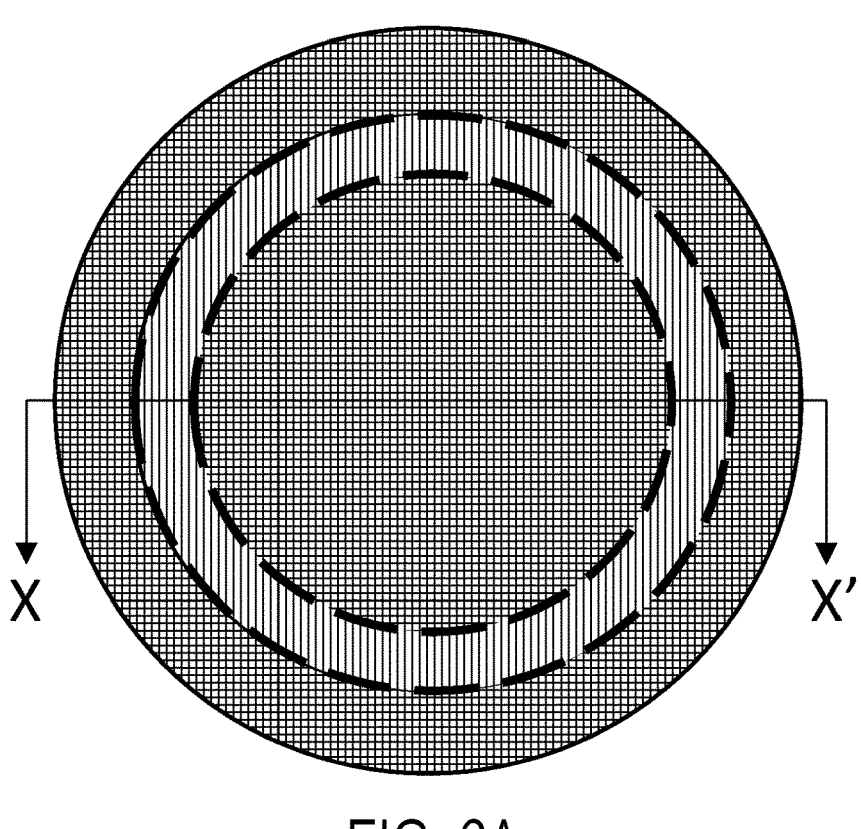
Figure 6B:
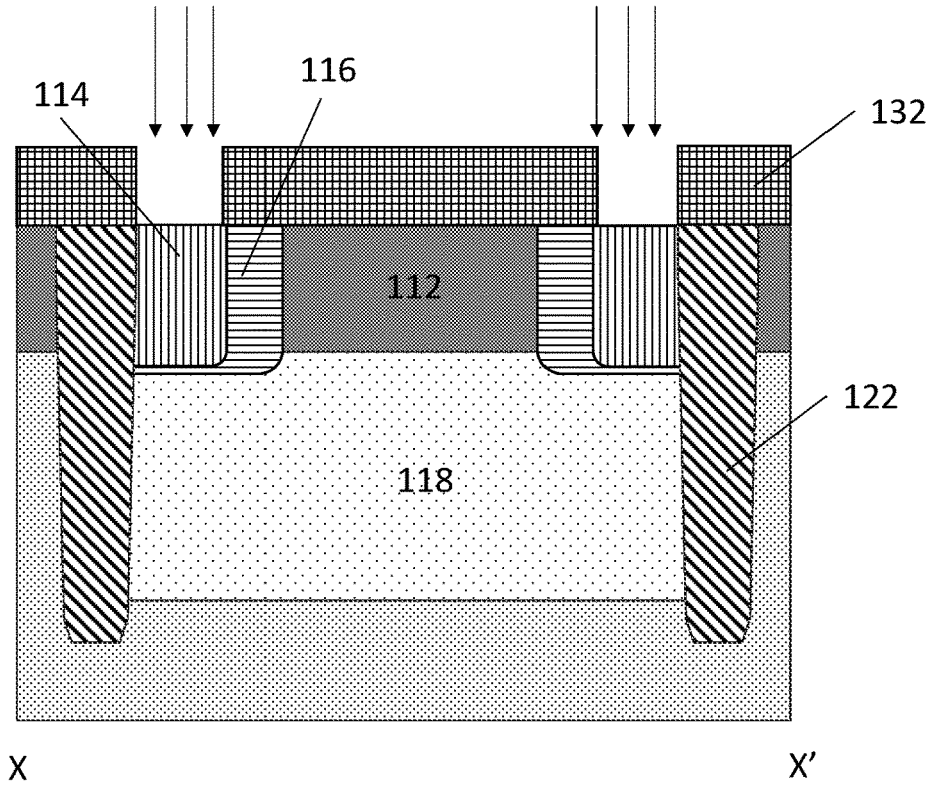

Referring to FIGS. 6A and 6B, the method includes forming first doped regions 114 by implanting dopants of the second conductivity type (e.g., N-type dopants). For example, after a photoresist pattern 132 is formed on the upper surface of the resulting structure of FIGS. 5A and 5B, dopants are implanted to form the first doped regions 114 using the photoresist pattern 132 as a mask. In an embodiment, the resist pattern 132 includes an inner portion having a substantially cylindrical shape and an outer portion having a ring shape, thereby creating an opening between the inner portion and the outer portion. The method further includes forming second doped regions 116 by diffusing the dopants in the first doped regions 114 using a subsequent process (e.g., an anneal process) at a relatively high temperature.

Figure 7A:
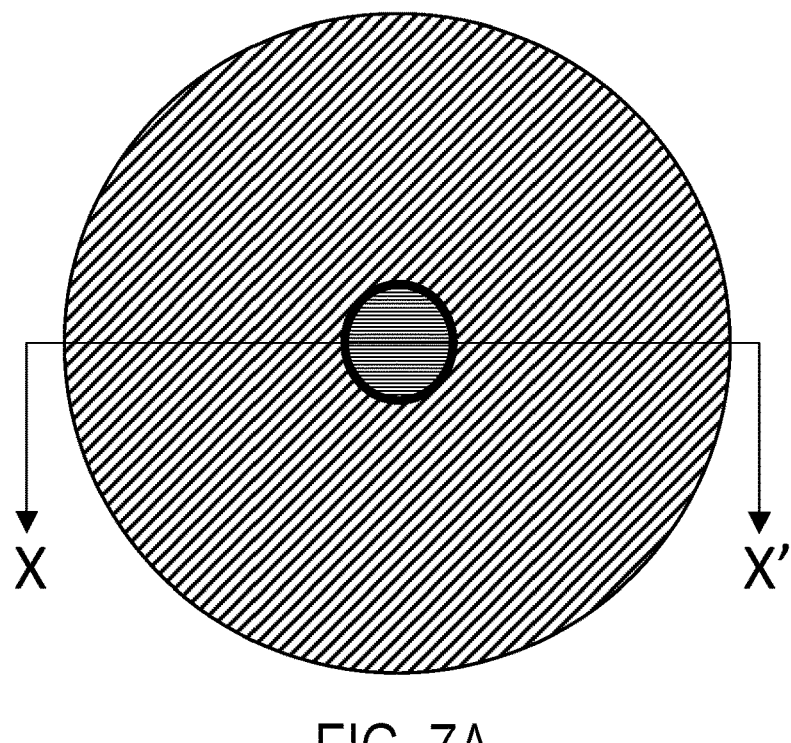
Figure 7B:
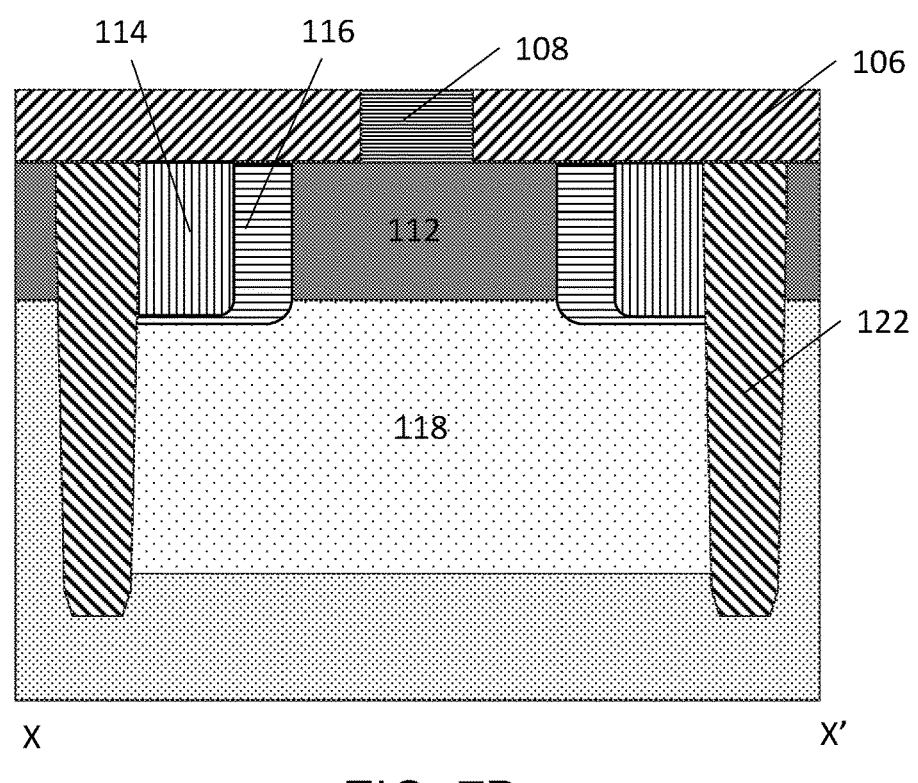

Referring to FIGS. 7A and 7B, the method includes forming a dielectric layer 106. In an embodiment, forming the dielectric layer 106 includes removing the resist pattern 132, depositing a dielectric material layer, and forming an opening in the dielectric material layer to form the dielectric layer 106. Forming the dielectric layer 106 may include depositing a dielectric material layer having a single-layer structure or a multi-layer structure (e.g., oxide-nitride-oxide stack) over the multiplication layer 112, the first and second doped regions 114 and 116, and the isolation structure 122, and performing an etching process on the deposited dielectric material layer to form an opening that exposes a portion of the multiplication layer 112.

The method further includes forming a charge layer 108 in the opening of the dielectric layer 106. In an embodiment, the charge layer 108 is formed as a silicon epitaxial layer including dopants of the first conductivity type. For example, the method includes selective epitaxial growth of silicon over the exposed portion of the intrinsic silicon layer 112 with in-situ doping of P-type dopants.

Figure 8A:
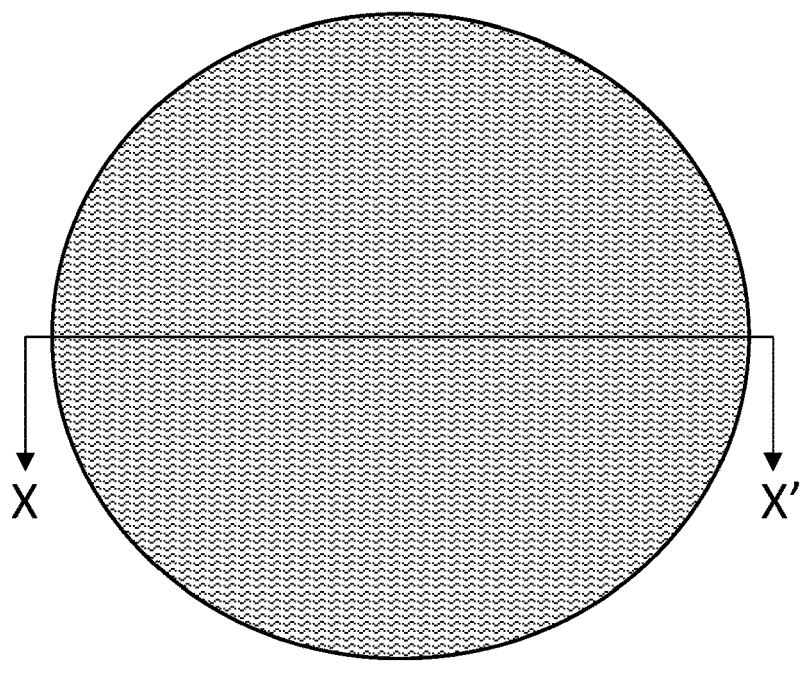
Figure 8B:
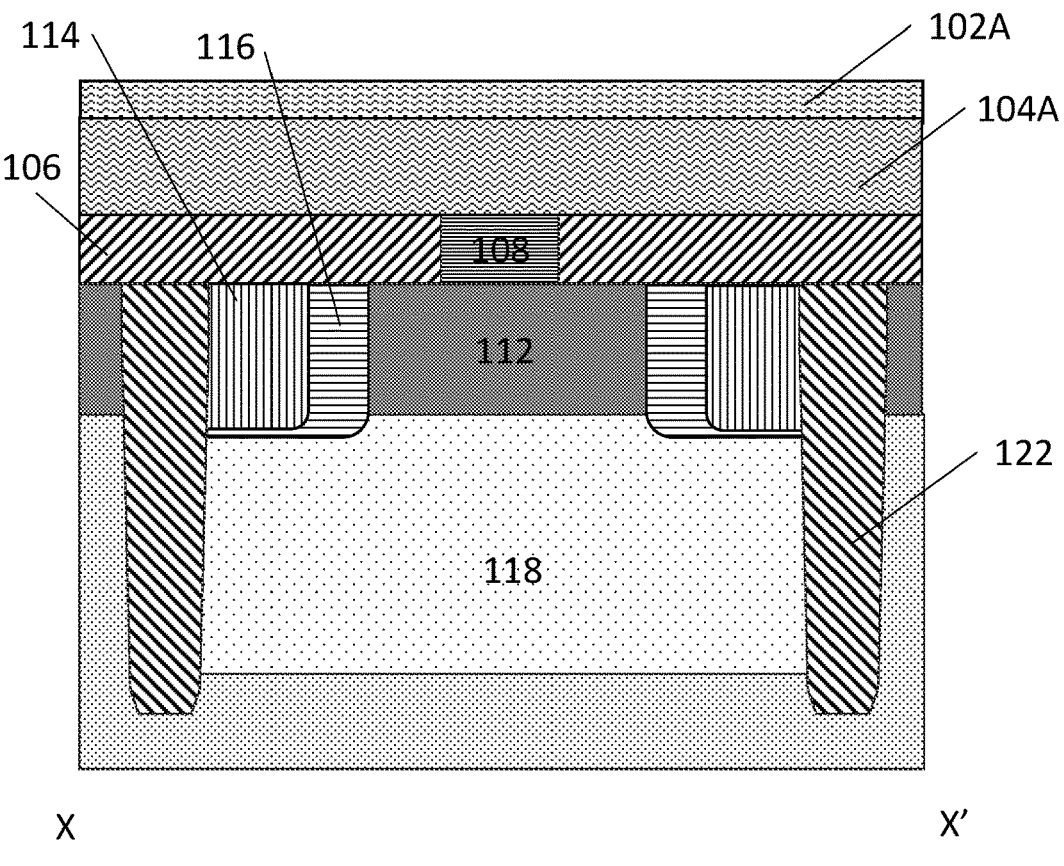

Referring to FIGS. 8A and 8B, the method includes forming an absorption material layer 104A over the resulting structure of FIGS. 7A and 7B. In an embodiment, the absorption material layer 104A is formed as an epitaxial SiGe layer including dopants of the same conductivity type as those of the charge layer 108 and having a doping concentration lower than a doping concentration of the charge layer 108.

The method further includes forming a contact material layer 102A over the absorption material layer 104A. In an embodiment, the contact material layer 102A is formed as a silicon epitaxial layer including dopants of the same conductivity type as the absorption material layer 104A and having a doping concentration greater than the concentration of the absorption material layer 104A. For example, the method includes blanket non-selective epitaxial growth of silicon over the absorption material layer 104A with in-situ doping of P-type dopants.

The method may further include, after forming the contact material layer 102A, performing a heat treatment process on the resulting structure of FIGS. 8A and 8B. In an embodiment, an anneal process (e.g., rapid thermal annealing with an oxygen gas) is performed to reduce the number of traps formed at an interface between the absorption material layer 104A (e.g., SiGe-epi layer) and the charge layer 108 (e.g., Si-epi layer) and an interface between the absorption material layer 104A and the dielectric layer 106.

Figure 9A:
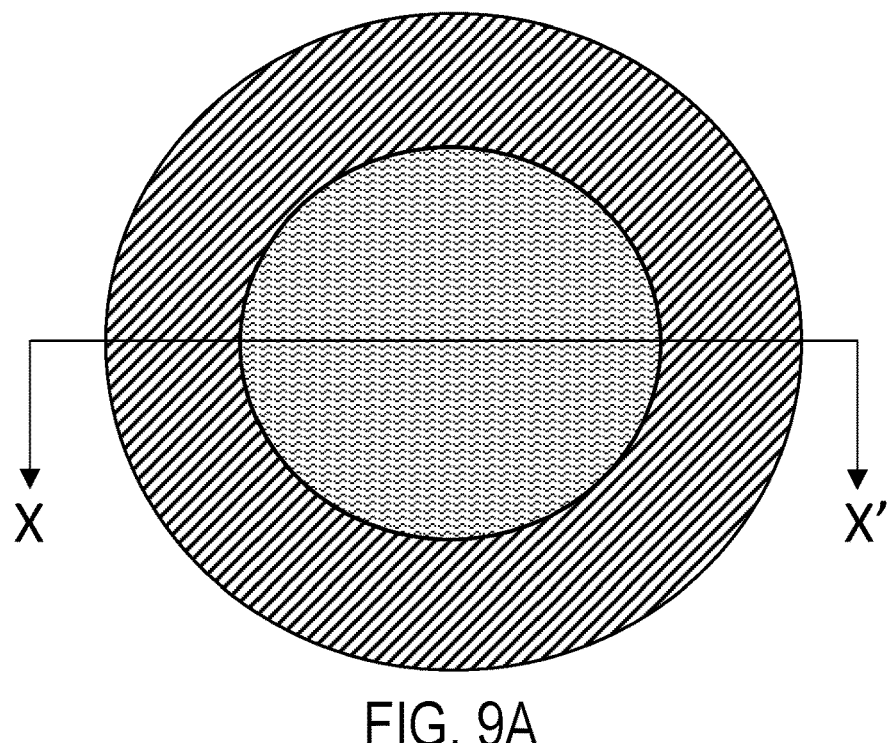
Figure 9B:
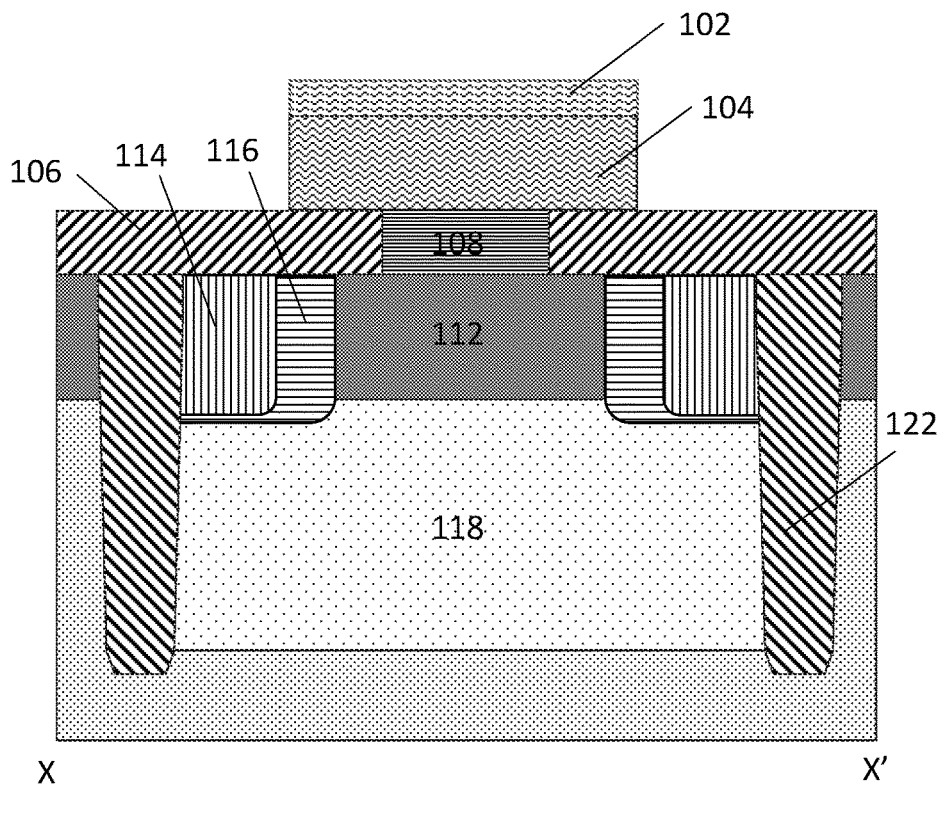

Referring to FIGS. 9A and 9B, the method includes forming the contact layer 102 and the absorption layer 104 by patterning the contact material layer 102A and the absorption material layer 104A, respectively. In an embodiment, a mask pattern (not shown) is formed to expose an outer portion of the contact material layer 102A, and an etching process (e.g., reactive-ion etching) is performed to pattern the contact material layer 102A and the absorption material layer 104A. Although not shown in FIGS. 9A and 9B, after forming the contact layer 102 and the absorption layer 104, electrodes (e.g., the first and second electrodes 126 and 124 in FIG. 1) may be formed to be coupled to the first doped regions 114 and the contact layer 102.

Figure 10:
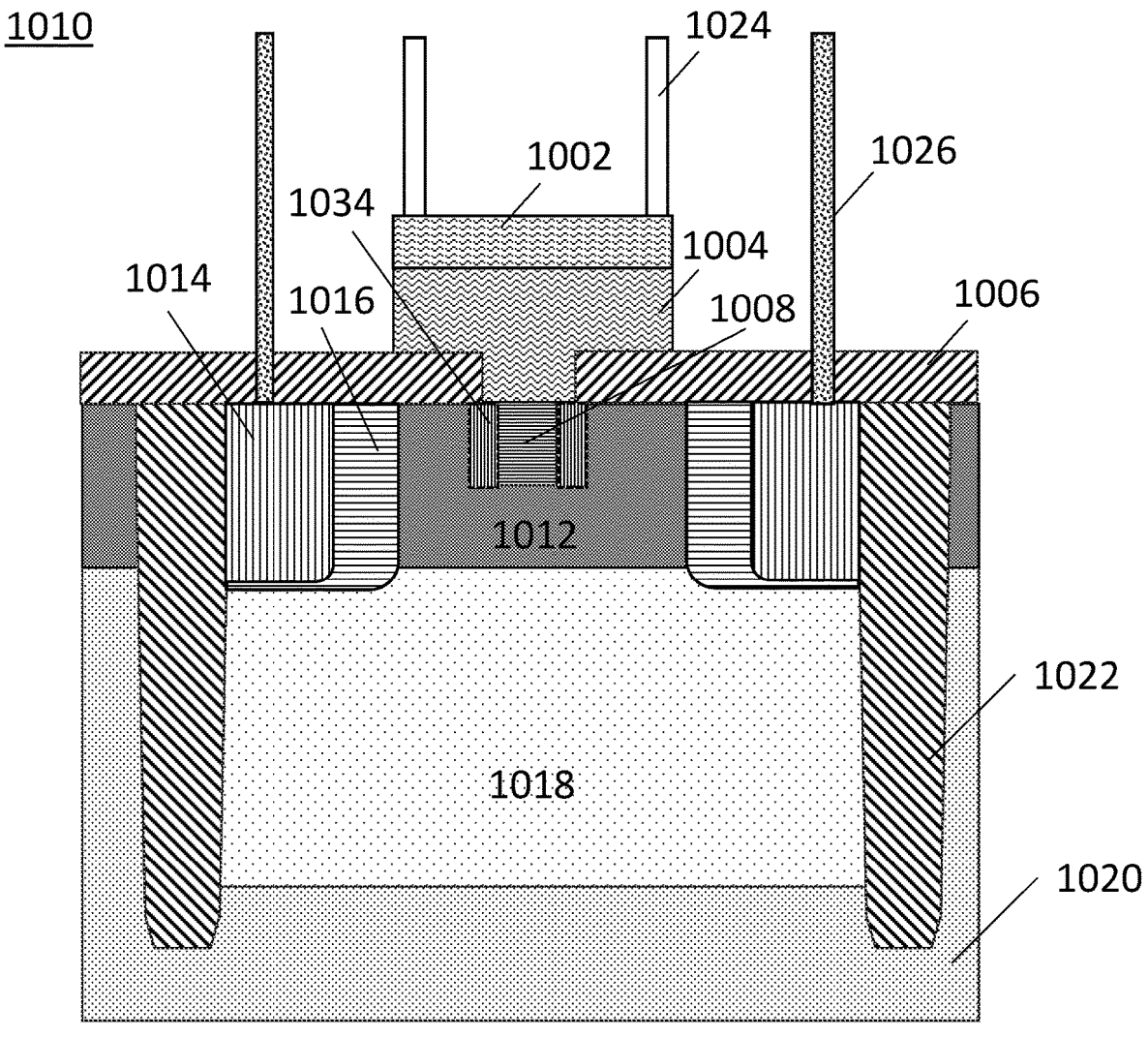
FIG. 10 illustrates a simplified cross-sectional view of a photodiode device according to another embodiment.

FIG. 10 illustrates a simplified cross-sectional view of a photodiode device 1010 according to another embodiment. The photodiode device 1010 in FIG. 10 includes similar elements to those of the photodiode device 110 of FIG. 1, and thus detailed descriptions on these elements may be omitted in the following disclosure in the interest of brevity.

The photodiode device 1010 of FIG. 10 differs from the photodiode device 110 of FIG. 1 in that the photodiode device 1010 includes a charge layer 1008 disposed in a multiplication layer 1012, rather than in a dielectric layer 1006. Without having an interface between the charge layer 1008 and the dielectric layer 1006 at which traps may be formed, the photodiode device 1010 including the charge layer 1008 of FIG. 10 may include a relatively small number of traps compared to the photodiode device 110 including the charge layer 108 of FIG. 1. As a result, recombination of photon-generated carriers may be reduced in the photodiode device 1010 of FIG. 10 compared to the photodiode device 110 of FIG. 1.

The photodiode device 1010 of FIG. 10 further differs from the photodiode device 110 of FIG. 1 in that an absorption layer 1004 includes a lower portion disposed in the opening of the dielectric layer 1006 and an upper portion disposed over the lower portion and extending over a surface (e.g., an upper surface) of the dielectric layer 1006. In an embodiment, the absorption layer 1004 has the upper portion with a first width and the lower portion with a second width that is less than the first width. Since the width of the lower portion of the absorption layer 1004 is less than the width of the upper portion of the absorption layer 1004, the lower portion of the absorption layer 1004 may effectively guide photon-generated electrons to the multiplication layer 1012 through the charge layer 1008.

In addition, the photodiode device 1010 of FIG. 10 differs from the photodiode device 110 of FIG. 1 in that the photodiode device 1010 includes a guard ring 1034 disposed in the multiplication layer 1012 and the charge layer 1008 is wrapped around by the guard ring 1034. The guard ring 1034 of FIG. 10 may prevent premature breakdown at an edge of the charge layer 1008. In an embodiment, the guard ring 1034 includes the same conductivity type of dopants as the charge layer 1008 while having a doping concentration smaller than a doping concentration of the charge layer 1008.

FIGS. 11A, 11B, 12A, 12B, 13A, 13B, 14A, and 14B illustrate a method of fabricating the embodiment of the photodiode device 1010 in FIG. 10. Specifically, FIGS. 11A, 12A, 13A, and 14A are simplified top views, and FIGS. 11B, 12B, 13B, and 14B, are simplified cross-sectional views along the line X-X' shown in FIGS. 11A, 12A, 13A, and 14A, respectively. The method of fabricating the photodiode device 1010 in FIG. 10 includes similar processes to those of the method of fabrication the photodiode device 110 in FIG. 1, and thus detailed descriptions on these processes may be omitted in the following disclosure in the interest of brevity.

Figure 11A:
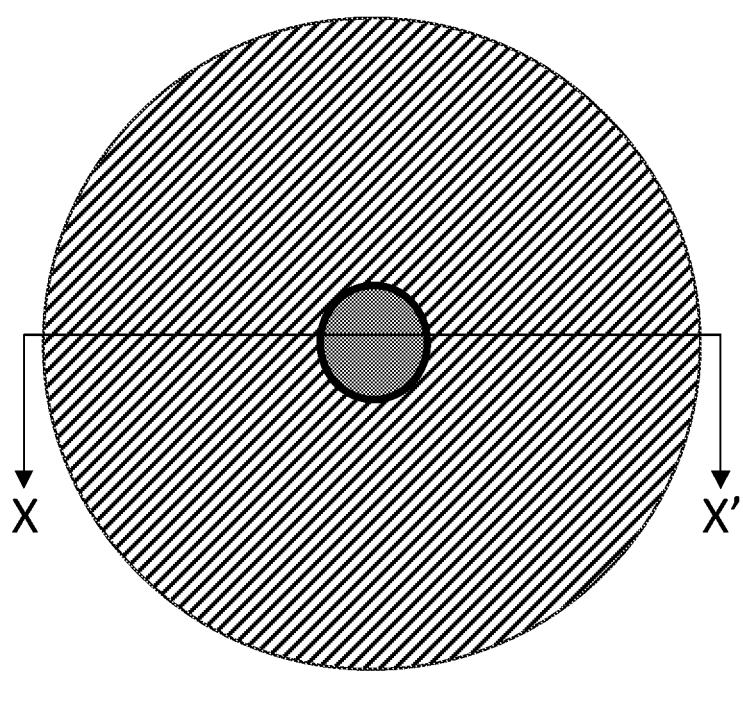
FIGS. 11A, 11B, 12A, 12B, 13A, 13B, 14A, and 14B illustrate a method of fabricating the photodiode device in FIG. 10 according to an embodiment.
Figure 11B:
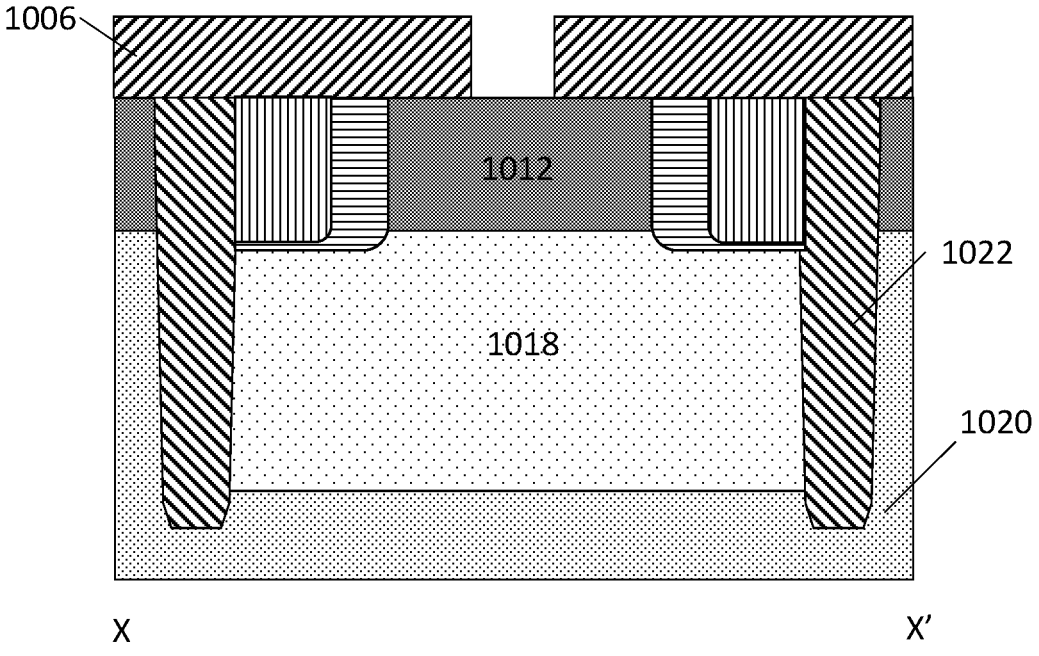

Referring to FIGS. 11A and 11B, the method includes forming the dielectric layer 1006. In an embodiment, forming the dielectric layer 1006 includes depositing a layer of dielectric material, and forming an opening in the dielectric material layer.

Figure 12A:
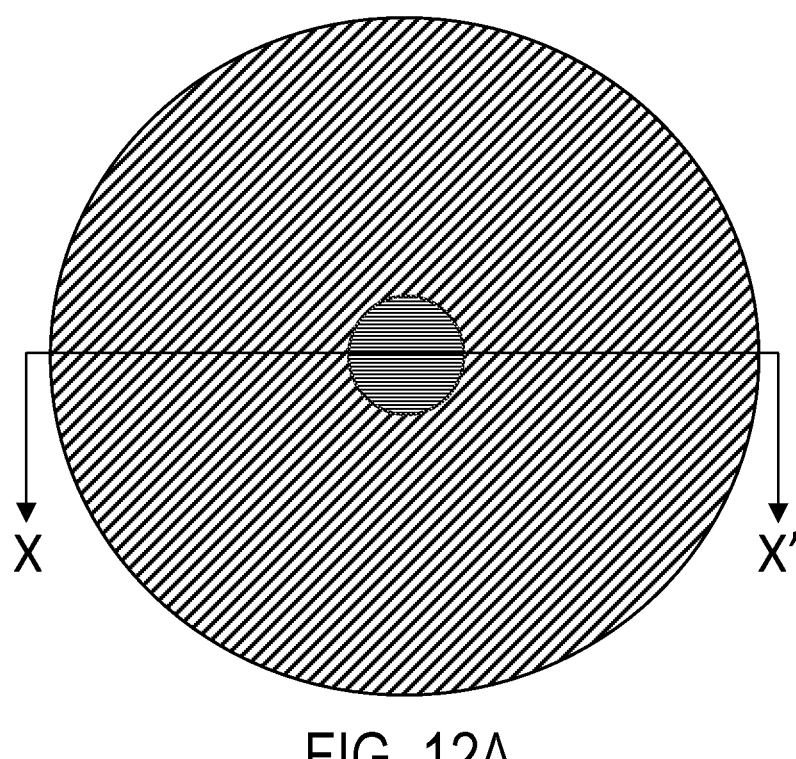
Figure 12B:
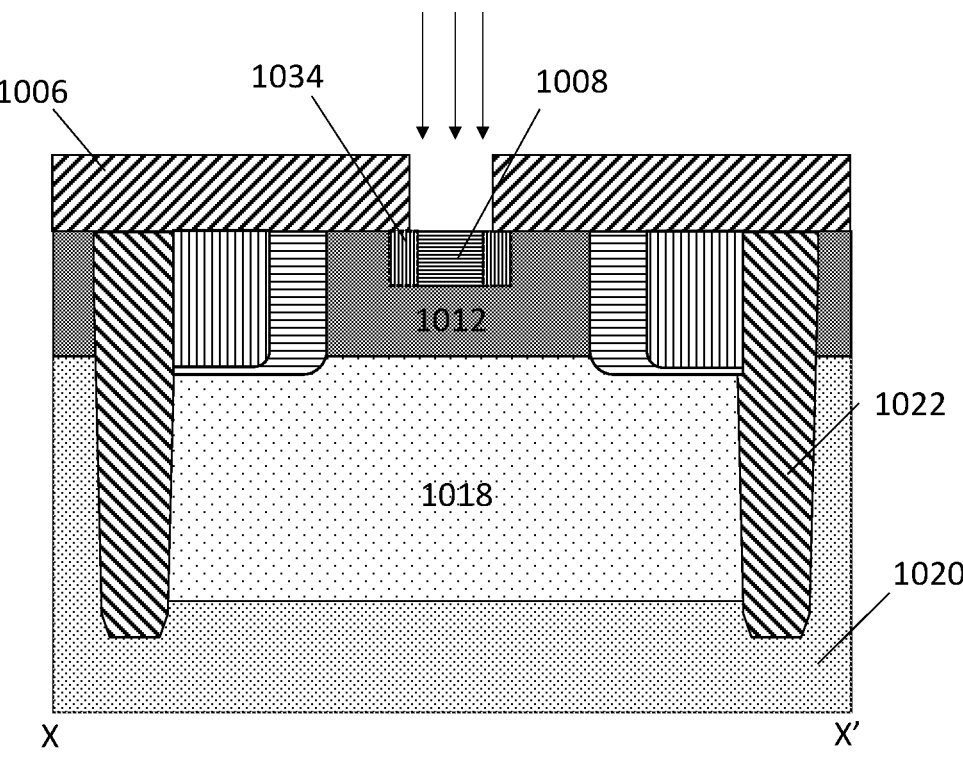

Referring to FIGS. 12A and 12B, the method includes forming the charge layer 1008. In an embodiment, the charge layer 1008 is formed by injecting dopants of a first conductivity type into the multiplication layer 1012. For example, the charge layer 1008 is formed by implanting P-type dopants into the multiplication layer 1012 using the dielectric layer 1006 as a mask for the implantation.

The method further includes forming the guard ring 1034. In an embodiment, the guard ring 1034 is formed by diffusing dopants in the charge layer 1008 using a subsequent process (e.g., an anneal process) at a relatively high temperature.

Figure 13A:
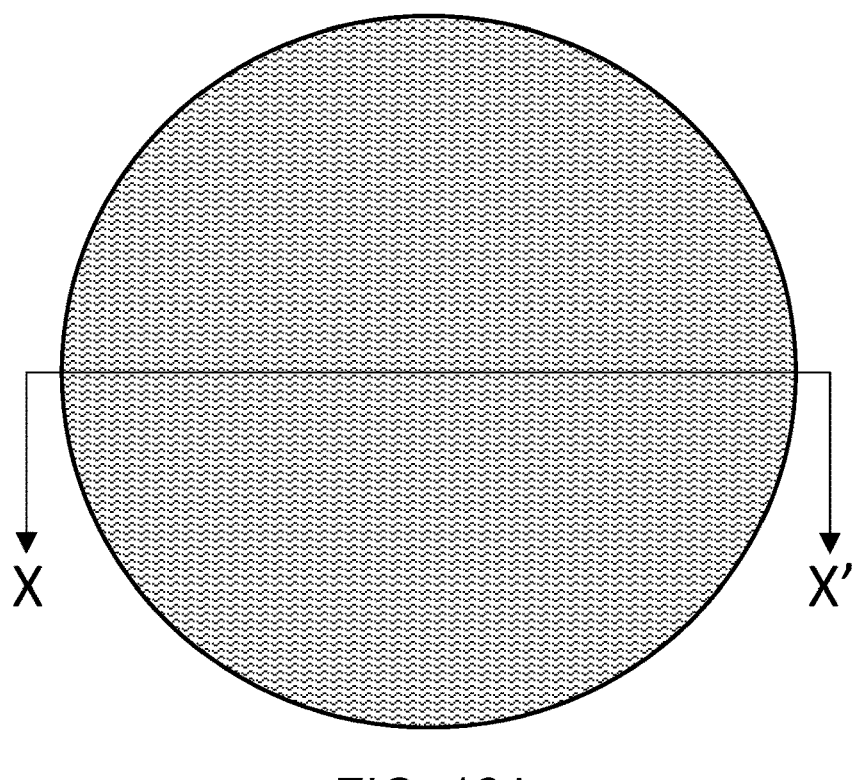
Figure 13B:
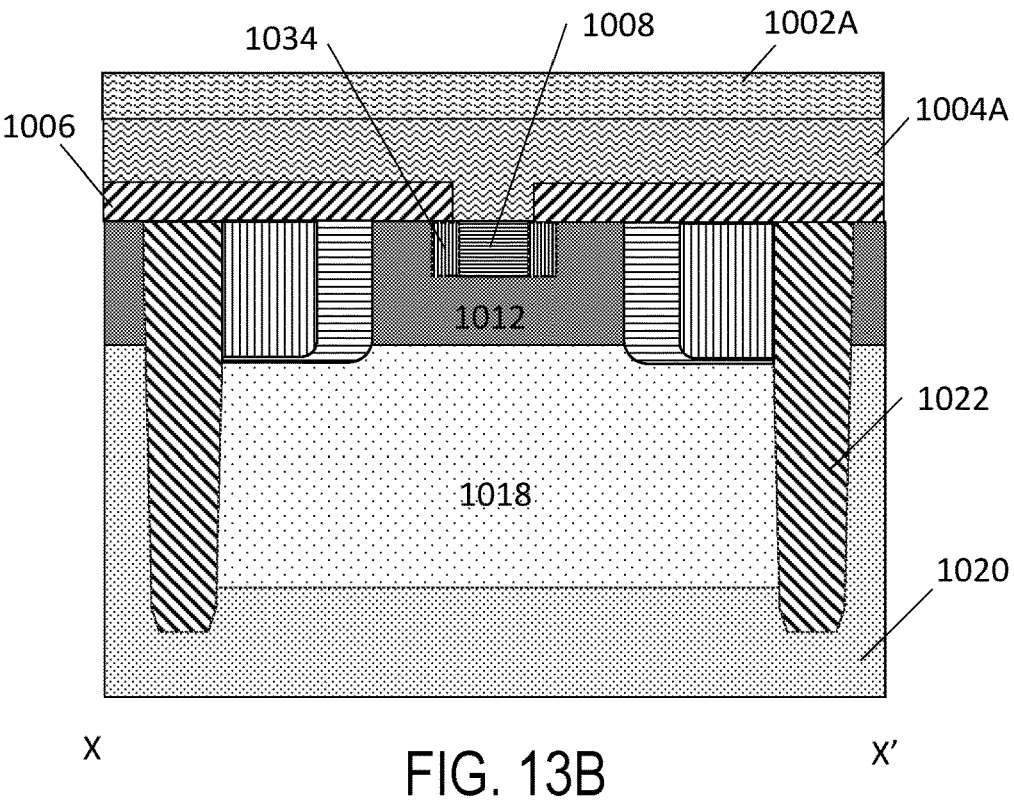

Referring to FIGS. 13A and 13B, the method includes forming an absorption material layer 1004A over the resulting structure of FIGS. 12A and 12B. In an embodiment, the absorption material layer 1004A is formed as an epitaxial SiGe layer including dopants of the same conductivity type as those of the charge layer 1008 and having a doping concentration lower than the doping concentration of the charge layer 1008.

The method further includes forming a contact material layer 1002A over the adsorption material layer 1004A. In an embodiment, the contact material layer 1002A is formed as a silicon epitaxial layer including dopants of the same conductivity type as the absorption material layer 1004A and having a doping concentration greater than the doping concentration of the absorption material layer 1004A.

The method may further include, after forming the contact material layer 1002A, performing a heat treatment process on the resulting structure of FIGS. 13A and 13B. In an embodiment, an anneal process (e.g., rapid thermal annealing with an oxygen gas) is performed to reduce the number of traps formed at an interface between the absorption material layer 1004A (e.g., SiGe-epi layer) and the charge layer 1008 (e.g., Si-epi layer) and an interface between the absorption material layer 1004A and the dielectric layer 1006.

Figure 14A:
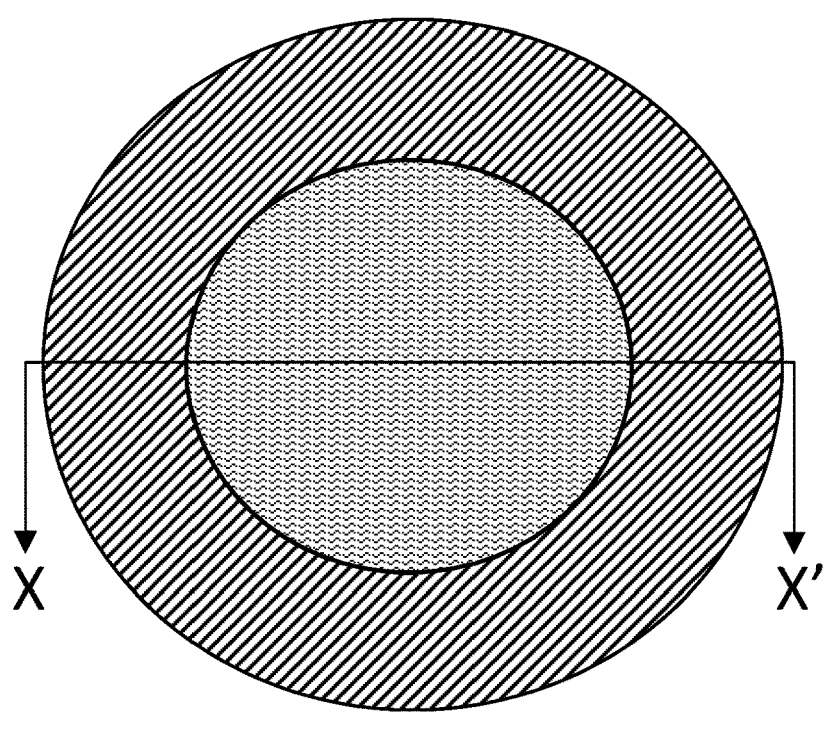
Figure 14B:
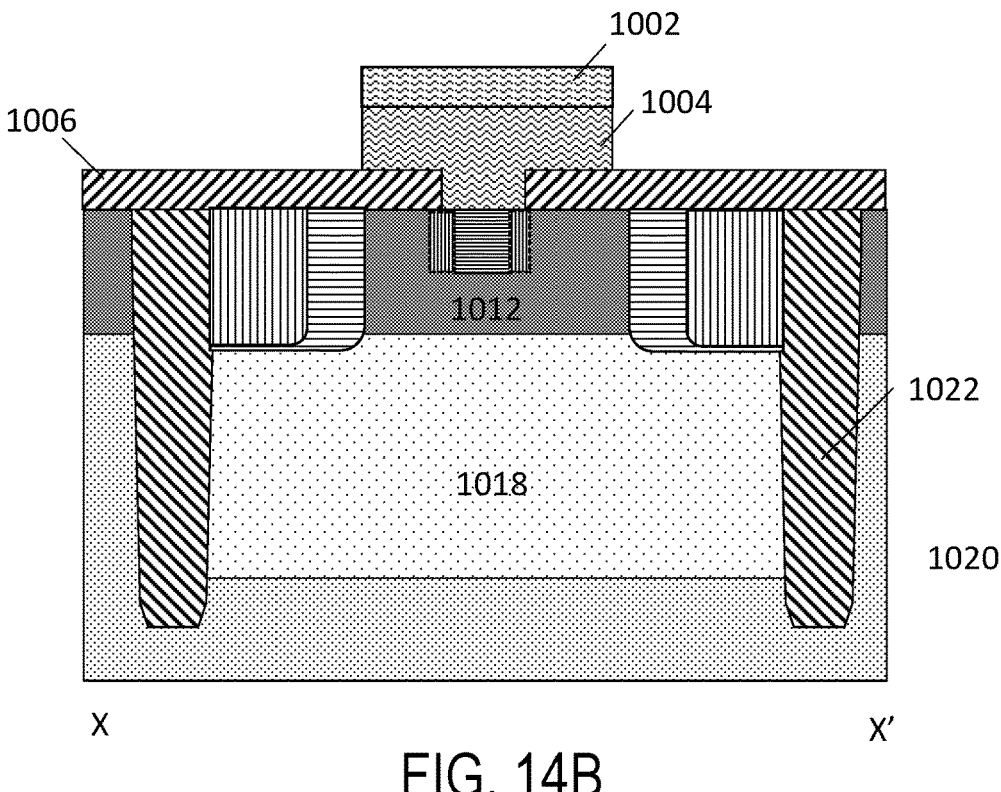

Referring to FIGS. 14A and 14B, the method includes forming the contact layer 1002 and the absorption layer 1004 by patterning the contact material layer 1002A and the absorption material layer 1004A, respectively. In an embodiment, a mask pattern (not shown) is formed to expose an outer portion of the contact material layer 1002A, and an etching process (e.g., reactive-ion etching) may be performed to pattern the contact material layer 1002A and the absorption material layer 1004A. Although not shown in FIGS. 14A and 14B, after forming the contact layer 1002 and the absorption layer 1004, electrodes (e.g., first and second electrodes 1026 and 1024 in FIG. 10) may be formed to be coupled to first doped regions 1014 and the contact layer 1002.

A photodiode device according to an embodiment of the present disclosure may include an absorption layer having a relatively large optically sensitive area for collecting incident photons, thereby increasing a fill factor. Such a photodiode device may further include a charge layer that is doped with a relatively high concentration for providing a strong electric field and has a relatively small area for guiding the transportation of photon-generated carriers into a multiplication layer, thereby reducing carrier recombination. With the increased fill factor and reduced carrier recombination, quantum efficiency of the photodiode device according to an embodiment of the present disclosure may be increased compared to that of a conventional photodiode device.

Figure 15:
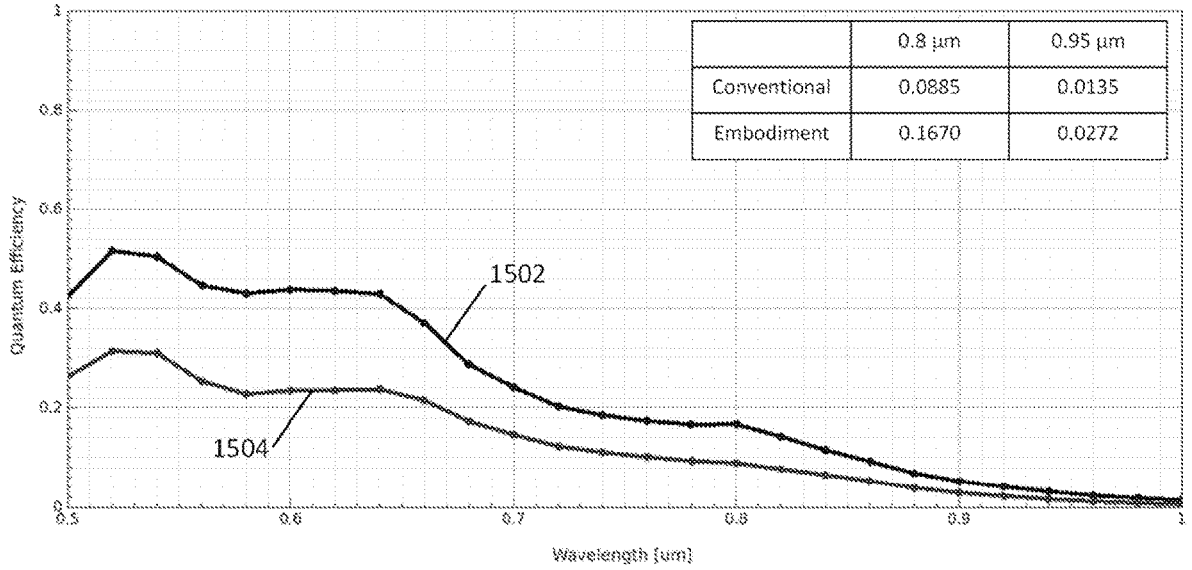
FIG. 15 illustrates quantum efficiency of a photodiode device according to an embodiment.

FIG. 15 illustrates quantum efficiency of the photodiode device 110 in FIG. 2 according to an embodiment of the present disclosure. Referring to FIG. 15, a first line 1502 represents quantum efficiency values of the photodiode device 110 according to an embodiment of the present disclosure, and a second line 1504 represents quantum efficiency values of a conventional photodiode device. The conventional photodiode device may include a multiplication layer with a first width, a charge layer with a second width, and an absorption layer with a third width, where the first width, the second width, and the third width may be substantially the same.

The photodiode device 110 according to an embodiment of the present disclosure may have quantum efficiency values higher than those of a conventional diode device. Referring to FIG. 15, at the wavelength of 0.95 μm within a near-infrared range, the photodiode device 110 according to an embodiment of the present disclosure has a quantum efficiency (0.0272) that is about twice the quantum efficiency (0.0135) of the conventional photodiode device.

A photodiode device according to an embodiment of the present disclosure may also include a charge layer having a relatively small size to make the charge layer sufficiently spaced apart from adjacent doped regions. As a result, premature breakdown at edges of the charge layer may be prevented. In addition, since the charge layer may be disposed between the absorption layer and the multiplication layer, thermally generated carriers in the absorption layer may be recombined while passing through the charge layer to substantially prevent avalanche effect in the multiplication layer. As a result, dark counts and afterpulsing may be reduced in a photodiode device according to an embodiment of the present disclosure.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

The invention claimed is:

1. A photodiode device, comprising:
   a semiconductor substrate;
   a multiplication layer disposed in the semiconductor substrate and having a first width;
   a dielectric layer disposed over the multiplication layer;

a charge layer coupled to the multiplication layer and having a second width smaller than the first width of the multiplication layer; and an absorption layer disposed over the charge layer and having a third width greater than the second width of the charge layer, wherein the dielectric layer has an opening with a fourth width, and the fourth width is smaller than the third width of the absorption layer, and wherein the absorption layer and the multiplication layer are separated from each other by the charge layer and the dielectric layer.

2. The photodiode device of claim 1, wherein the charge layer is disposed in the opening of the dielectric layer.

3. The photodiode device of claim 1, further comprising a guard ring disposed in the multiplication layer, wherein the charge layer is disposed in the multiplication layer and is wrapped around by the guard ring.

4. The photodiode device of claim 3, wherein the absorption layer includes a lower portion disposed in the opening of the dielectric layer and an upper portion disposed over the lower portion.

5. The photodiode device of claim 1, wherein the charge layer includes dopants of a first conductivity type, the photodiode device further comprising:

a first doped region of a second conductivity type spaced apart from the charge layer by a distance sufficient to prevent breakdown at an edge of the charge layer.

6. The photodiode device of claim 5, further comprising:

a second doped region of the second conductivity type disposed farther from the charge layer than the first doped region; and a well region of the second conductivity type over which the multiplication layer, the first doped region, and the second region are disposed.

7. The photodiode device of claim 6, wherein the well region has a retrograde doping profile.

8. The photodiode device of claim 1, wherein the absorption layer is an epitaxial SiGe layer, the charge layer is a silicon epitaxial layer, and the multiplication layer is an intrinsic silicon epitaxial layer.

9. The photodiode device of claim 1, wherein the multiplication layer has the first width in a first direction, the charge layer has the second width in the first direction, the absorption layer has the third width in the first direction, and the multiplication layer, the charge layer, and the absorption layer are stacked in a second direction orthogonal to the first direction, and wherein a ratio of the third width of the absorption layer to the second width of the charge layer is in a range from 1.5 to 2.5.

10. The photodiode device of claim 1, wherein the device is a single-photon avalanche diode (SPAD).

11. A photodetector, comprising:

a photodiode device configured to detect near-infrared (NIR) photons; and a control circuit configured to control an operation of the photodiode device, wherein the photodiode device includes:

a semiconductor substrate;

a multiplication layer disposed in the semiconductor substrate and having a first width;

a dielectric layer disposed over the multiplication layer;

a charge layer coupled to the multiplication layer and having a second width smaller than the first width of the multiplication layer; and an absorption layer disposed over the charge layer and having a third width greater than the second width of the charge layer, wherein the dielectric layer has an opening with a fourth width, and the fourth width is smaller than the third width of the absorption layer, and wherein the charge layer is disposed in the opening of the dielectric layer.

12. The photodetector of claim 11, wherein the charge layer includes dopants of a first conductivity type, the photodetector further comprising a doped region of a second conductivity type spaced apart from the charge layer by a distance sufficient to prevent breakdown at an edge of the charge layer.

13. A method of forming a photodiode device, the method comprising:

providing a substrate;

forming a multiplication layer that has a first width in the substrate;

forming a dielectric layer over the multiplication layer;

forming a charge layer that has a second width smaller than the first width of the multiplication layer; and forming an absorption layer over the charge layer, the absorption layer having a third width greater than the second width of the charge layer, wherein forming the dielectric layer includes:

forming a dielectric material layer over the multiplication layer; and forming an opening in the dielectric material layer to form a dielectric layer, the opening having a fourth width smaller than the third width of the absorption layer, and wherein the absorption layer and the multiplication layer are separated from each other by the charge layer and the dielectric layer.

14. The method of claim 13, wherein forming the charge layer includes performing silicon epitaxial growth over a portion of the multiplication layer exposed by the opening with in-situ doping of a first conductivity type.

15. The method of claim 14, further comprising:

forming a first doped region of a second conductivity type that is spaced apart from the charge layer by a distance sufficient to prevent breakdown at an edge of the charge layer; and forming a second doped region of the second conductivity type that is disposed farther from the charge layer than the first doped region.

16. The method of claim 13, wherein dopants of a first conductivity type are injected into the multiplication layer to form the charge layer in the multiplication layer.

17. The method of claim 16, further comprising forming a guard ring by diffusing the dopants of the first conductivity type in the charge layer.

18. The photodiode device of claim 1, wherein the dielectric layer has an opening with a fourth width, and the fourth width is smaller than the third width of the absorption layer, and wherein the absorption layer includes a lower portion disposed in the opening of the dielectric layer and an upper portion disposed over the lower portion.

* * * * *